United States Patent
Mei et al.

(10) Patent No.: US 10,840,607 B2
(45) Date of Patent: Nov. 17, 2020

(54) CELLULAR COMMUNICATION SYSTEMS HAVING ANTENNA ARRAYS THEREIN WITH ENHANCED HALF POWER BEAM WIDTH (HPBW) CONTROL

(71) Applicant: CommScope Technologies LLC, Hickory, NC (US)

(72) Inventors: Xia Mei, Suzhou (CN); Yuemin Li, Suzhou (CN); Martin L. Zimmerman, Chicago, IL (US); Haifeng Li, Suzhou (CN); Long Shan, Suzhou (CN)

(73) Assignee: CommScope Technologies LLC, Hickory, NC (US)

( * ) Notice: Subject to any disclaimer, the term of this patent is extended or adjusted under 35 U.S.C. 154(b) by 149 days.

(21) Appl. No.: 16/013,262

(22) Filed: Jun. 20, 2018

(65) Prior Publication Data

US 2018/0375220 A1 Dec. 27, 2018

Related U.S. Application Data

(60) Provisional application No. 62/523,386, filed on Jun. 22, 2017.

(51) Int. Cl.
*H01Q 21/24* (2006.01)
*H01Q 1/24* (2006.01)
(Continued)

(52) U.S. Cl.
CPC ............... *H01Q 21/24* (2013.01); *H01P 5/16* (2013.01); *H01P 5/18* (2013.01); *H01Q 1/246* (2013.01);
(Continued)

(58) Field of Classification Search
CPC ............ H01Q 21/24; H01Q 1/24; H01Q 1/52; H01Q 21/00; H01Q 21/08
(Continued)

(56) References Cited

U.S. PATENT DOCUMENTS

| 6,943,732 B2 | 9/2005 | Goettl et al. |
| 7,050,005 B2 | 5/2006 | Goettl et al. |

(Continued)

FOREIGN PATENT DOCUMENTS

| CA | 1 226 936 A | 9/1987 |
| CN | 206461086 U | 9/2017 |

(Continued)

OTHER PUBLICATIONS

Extended European Search Report for corresponding European Patent Application No. 18153870.3, dated Jun. 26, 2018, 9 pgs.

*Primary Examiner* — Andrea Lindgren Baltzell
(74) *Attorney, Agent, or Firm* — Myers Bigel, P.A.

(57) ABSTRACT

Antenna arrays include first and second radiating elements, which are responsive to respective first and second hybrid radio frequency (RF) signals, and a power divider circuit. The power divider circuit is configured to generate the first and second hybrid RF signals as power-reduced combinations of first and second RF input signals received at input terminals thereof. For example, the first hybrid RF signal may be generated as a combination of a 70-90 percent energy contribution of the first RF input signal with a 0.26-2.7 percent energy contribution of the second RF input signal. Similarly, the second hybrid RF signal may be generated as a 70-90 percent energy contribution of the second RF input signal with a 0.26-2.7 percent energy contribution of the first RF input signal.

20 Claims, 14 Drawing Sheets

(51) Int. Cl.
*H01Q 1/52* (2006.01)
*H01Q 21/08* (2006.01)
*H01P 5/18* (2006.01)
*H01P 5/16* (2006.01)
*H01Q 21/00* (2006.01)
*H03H 7/48* (2006.01)

(52) U.S. Cl.
CPC ......... *H01Q 1/521* (2013.01); *H01Q 21/0006* (2013.01); *H01Q 21/08* (2013.01); *H03H 7/48* (2013.01)

(58) Field of Classification Search
USPC .......................................................... 343/893
See application file for complete search history.

(56) References Cited

U.S. PATENT DOCUMENTS

| | | |
|---|---|---|
| 8,416,142 B2 | 4/2013 | Goettl |
| 9,438,278 B2 | 9/2016 | Barker et al. |
| 9,444,151 B2 | 9/2016 | Kurk et al. |
| 2004/0051677 A1 | 3/2004 | Goettl |
| 2009/0179814 A1 | 7/2009 | Park et al. |
| 2009/0278759 A1 | 11/2009 | Moon et al. |
| 2011/0148730 A1* | 6/2011 | Gottl ........................ H01Q 5/28 343/793 |
| 2013/0271336 A1 | 10/2013 | Plet et al. |
| 2014/0225792 A1 | 8/2014 | Lee et al. |
| 2015/0222015 A1* | 8/2015 | Thalakotuna ............ H01Q 3/40 342/373 |
| 2019/0273315 A1 | 9/2019 | Hu et al. |

FOREIGN PATENT DOCUMENTS

| | | |
|---|---|---|
| EP | 0163997 A2 | 5/1987 |
| EP | 0325012 A1 | 7/1989 |
| KR | 101720485 | 3/2017 |
| WO | 99/36992 A2 | 7/1999 |
| WO | 2010/063007 | 6/2010 |

* cited by examiner

CELLULAR COMMUNICATION SYSTEMS HAVING ANTENNA ARRAYS THEREIN WITH ENHANCED HALF POWER BEAM WIDTH (HPBW) CONTROL

REFERENCE TO PRIORITY APPLICATION

This application claims priority to U.S. Provisional Application Ser. No. 62/523,386, filed Jun. 22, 2017, the disclosure of which is hereby incorporated herein by reference.

FIELD OF THE INVENTION

The present invention relates to radio communications and antenna devices and, more particularly, to base station antenna arrays for cellular communications and methods of operating same.

BACKGROUND

Phased array antennas can create and electronically steer a beam of radio waves in varying directions without physical movement of the radiating elements therein. As shown by FIG. 1A, in a phased array antenna 10, radio frequency (RF) feed current is provided from a transmitter (TX) to a plurality of spaced-apart antenna radiating elements via phase shifters ($\phi_1$-$\phi_8$), which establish a desired phase relationship between the radio waves emitted by the spaced-apart radiating elements. As will be understood by those skilled in the art, a properly established phase relationship enables the radio waves emitted from the radiating elements to combine to thereby increase radiation in a desired direction (shown as $\theta$), yet suppress radiation in an undesired direction(s). The phase shifters ($\phi_n$) are typically controlled by a computer control system (CONTROL), which can alter the phases of the emitted radio waves and thereby electronically steer the combined waves in varying directions. This electronic steering can be important when the phased array antennas are used in cellular communication and other RF-based systems.

For example, in a typical cellular communications system, a geographic area is often divided into a series of regions that are commonly referred to as "cells", which are served by respective base stations. Each base station may include one or more base station antennas (BSAs) that are configured to provide two-way radio frequency ("RF") communications with mobile subscribers that are within the cell served by the base station. In many cases, each base station is divided into "sectors." In perhaps the most common configuration, a hexagonally shaped cell is divided into three 120° sectors, and each sector is served by one or more base station antennas, which can have an azimuth Half Power Beam Width (HPBW) of approximately 65° per sector. Typically, the base station antennas are mounted on a tower or other raised structure and the radiation patterns (a/k/a "antenna beams") are directed outwardly therefrom. Base station antennas are often implemented as linear or planar phased arrays of radiating elements. For example, as shown by FIG. 1B, a base station antenna 10' may include side-by-side columns of radiating elements ($RE_{11}$-$RE_{18}$, $RE_{21}$-$RE_{28}$), which define a pair of relatively closely spaced antennas A1 and A2. In this base station antenna 10', each column of radiating elements may be responsive to respective phase-shifted feed signals, which are derived from corresponding RF feed signals (FEED1, FEED2) and transmitters (TX1, TX2) and varied in response to computer control (CONTROL1, CONTROL2).

In order to accommodate the ever-increasing volumes of cellular communications, cellular operators have added cellular services in a variety of new frequency bands. While in some cases it is possible to use linear arrays of so-called "wide-band" or "ultra wide-band" radiating elements to provide service in multiple frequency bands, in other cases it is necessary to use different linear arrays (or planar arrays) of radiating elements to support service in the different frequency bands.

As the number of frequency bands has proliferated, increased sectorization has become more common (e.g., dividing a cell into six, nine or even twelve sectors) and the number of base station antennas deployed at a typical base station has increased significantly. However, due to local zoning ordinances and/or weight and wind loading constraints for the antenna towers, etc. there is often a limit as to the number of base station antennas that can be deployed at a given base station. In order to increase capacity without further increasing the number of base station antennas, so-called multi-band base station antennas have been introduced in which multiple linear arrays of radiating elements are included in a single antenna. One very common multi-band base station antenna design is the RVV antenna, which includes one linear array of "low-band" radiating elements that are used to provide service in some or all of the 694-960 MHz frequency band, which is often referred to as the "R-band", and two linear arrays of "high-band" radiating elements that are used to provide service in some or all of the 1695-2690 MHz frequency band, which is often referred to as the "V-band". These linear arrays of R-band and V-band radiating elements are typically mounted in side-by-side fashion.

There is also significant interest in RRVV base station antennas, which can include two linear arrays of low-band radiating elements and two (or four) linear arrays of high-band radiating elements. For example, as shown by FIG. 1C, an RRVV antenna 12 may include two outside columns 14a, 14b of relatively low-band radiating elements (shown as 5 "large" radiating elements ("X") per column) and two inner columns 16a, 16b of relatively high-band radiating elements (shown as 9 "small" radiating elements ("x") per column). RRVV antennas may be used in a variety of applications including 4×4 multi-input-multi-output ("MIMO") applications or as multi-band antennas having two different low-bands (e.g., a 700 MHz low-band linear array and an 800 MHz low-band linear array) and two different high-bands (e.g., an 1800 MHz high-band linear array and a 2100 MHz high-band linear array). RRVV antennas, however, are challenging to implement in a commercially acceptable manner because achieving a 65° azimuth HPBW antenna beam in the low-band typically requires low-band radiating elements that are at least 200 mm wide. But, when two arrays of low-band radiating elements are placed side-by-side with high-band linear arrays therebetween, as shown by FIG. 1C, a base station antenna having a width of about 500 mm may be required. Such large RRVV antennas may have very high wind loading, may be very heavy, and/or may be expensive to manufacture. Operators would prefer RRVV base station antennas having widths of about 430 mm, which is a typical width for state-of-the-art base station antennas.

To achieve RRVV antennas having narrower beam widths, the dimensions of the low-band radiating elements may be reduced and/or the lateral spacing between the linear arrays of low-band "R" and high-band "V" radiating elements may be reduced. Unfortunately, as the linear arrays of radiating elements are aligned closer together, the degree of signal coupling between the linear arrays can increase significantly and this "parasitic" coupling can lead to an undesired increase in HPBW. Similarly, any reduction in the dimensions of the low-band radiating elements will often cause an increase in HPBW.

SUMMARY OF THE INVENTION

Antenna arrays according to some embodiments of the invention may include first and second radiating elements, which are responsive to respective first and second hybrid radio frequency (RF) signals, and a power divider circuit containing a first cascaded pair of power dividers cross-coupled with a second cascaded pair of power dividers. This power divider circuit is configured to generate the first and second hybrid RF signals as power-reduced combinations of first and second RF input signals received at input terminals thereof.

According to some of these embodiments of the invention, the first cascaded pair of power dividers can be responsive to the first RF input signal and a power-reduced version of the second RF input signal, and the second cascaded pair of power dividers can be responsive to the second RF input signal and a power-reduced version of the first RF input signal. For example, the first cascaded pair of power dividers may be configured to generate the first hybrid RF signal as a combination of a 70-90 percent energy contribution of the first RF input signal with a 0.26-2.7 percent energy contribution of the second RF input signal. Similarly, the second cascaded pair of power dividers may be configured to generate the second hybrid RF signal as a 70-90 percent energy contribution of the second RF input signal with a 0.26-2.7 percent energy contribution of the first RF input signal.

In some further embodiments of the invention, the first cascaded pair of power dividers may be configured to pass a portion of the second RF input signal through a first resistor to ground and the second cascaded pair of power dividers may be configured to pass a portion of the first RF input signal through a second resistor to ground. In particular, using the first resistor, the first cascaded pair of power dividers may be configured as a net lossy circuit with respect to any portion of the second RF input signal that is coupled thereto. And, using the second resistor, the second cascaded pair of power dividers may be configured as a net lossy circuit with respect to any portion of the first RF input signal that is coupled thereto. The first cascaded pair of power dividers and the second cascaded pair of power dividers may be selected from a group consisting of directional couplers, branch line couplers, Wilkinson power dividers and reactive T-splitters, and combinations thereof.

According to additional embodiments of the invention, an antenna array can include: first and second arrays of radiating elements, a first phase shifter, which is configured to generate a first plurality of RF feed signals that are phase-shifted relative to each other (in response to a first RF input feed signal), a second phase shifter, which is configured to generate a second plurality of RF feed signals that are phase-shifted relative to each other (in response to a second RF input feed signal); and a power divider circuit. This power divider circuit is configured to drive a first one of the first array of radiating elements with a first power-reduced combination of a first one of the first plurality of RF feed signals and a first one of the second plurality of RF feed signals. The power divider circuit is also configured to drive a first one of the second array of radiating elements with a second power-reduced combination of the first one of the first plurality of RF feed signals and the first one of the second plurality of RF feed signals. Preferably, the first power-reduced combination of the first one of the first plurality of RF feed signals and the first one of the second plurality of RF feed signals is defined as PSF1$n$*, where: PSF1$n$*=(k$_1$)PSF1$n$+(k$_2$)PSF2$n$, and where PSF1$n$ denotes the first one of the first plurality of RF feed signals, PSF2$n$ denotes the first one of the second plurality of RF feed signals, k$_1$ is a first power conversion coefficient and k$_2$ is a second power conversion coefficient, and where: $0.7 \leq k_1 \leq 0.90$ and $0.0026 \leq k_2 \leq 0.027$. Similarly, the second power-reduced combination of the first one of the first plurality of RF feed signals and the first one of the second plurality of RF feed signals is defined as PSF2$n$*, where PSF2$n$*=(k$_1$)PSF2$n$+(k$_2$)PSF1$n$.

According to further embodiments of the invention, a base station antenna is provided, which includes first and second arrays of low-band radiating elements extending adjacent first and second arrays of high-band radiating elements. A power divider circuit is also provided, which is responsive to a first feed signal having a first frequency associated with the first array of low-band radiating elements and a second feed signal having a second frequency associated with the second array of low-band radiating elements, which may be unequal to the first frequency. This power divider circuit is configured to drive a first low-band radiating element in the first array of low-band radiating elements with a first hybrid feed signal containing a power-reduced version of the first feed signal and a power-reduced version of the second feed signal, and further configured to drive a first low-band radiating element in the second array of low-band radiating elements with a second hybrid feed signal containing a power-reduced version of the second feed signal and a power-reduced version of the first feed signal. According to preferred aspects of these embodiments of the invention, the first hybrid feed signal is generated as a 10%-30% power-reduced version of the first feed signal and a 97.3%-99.74% power-reduced version of the second feed signal, and the second hybrid feed signal is generated as a 10%-30% power-reduced version of the second feed signal and a 97.3%-99.74% power-reduced version of the first feed signal.

DETAILED DESCRIPTION OF EMBODIMENTS

Figure 1A:
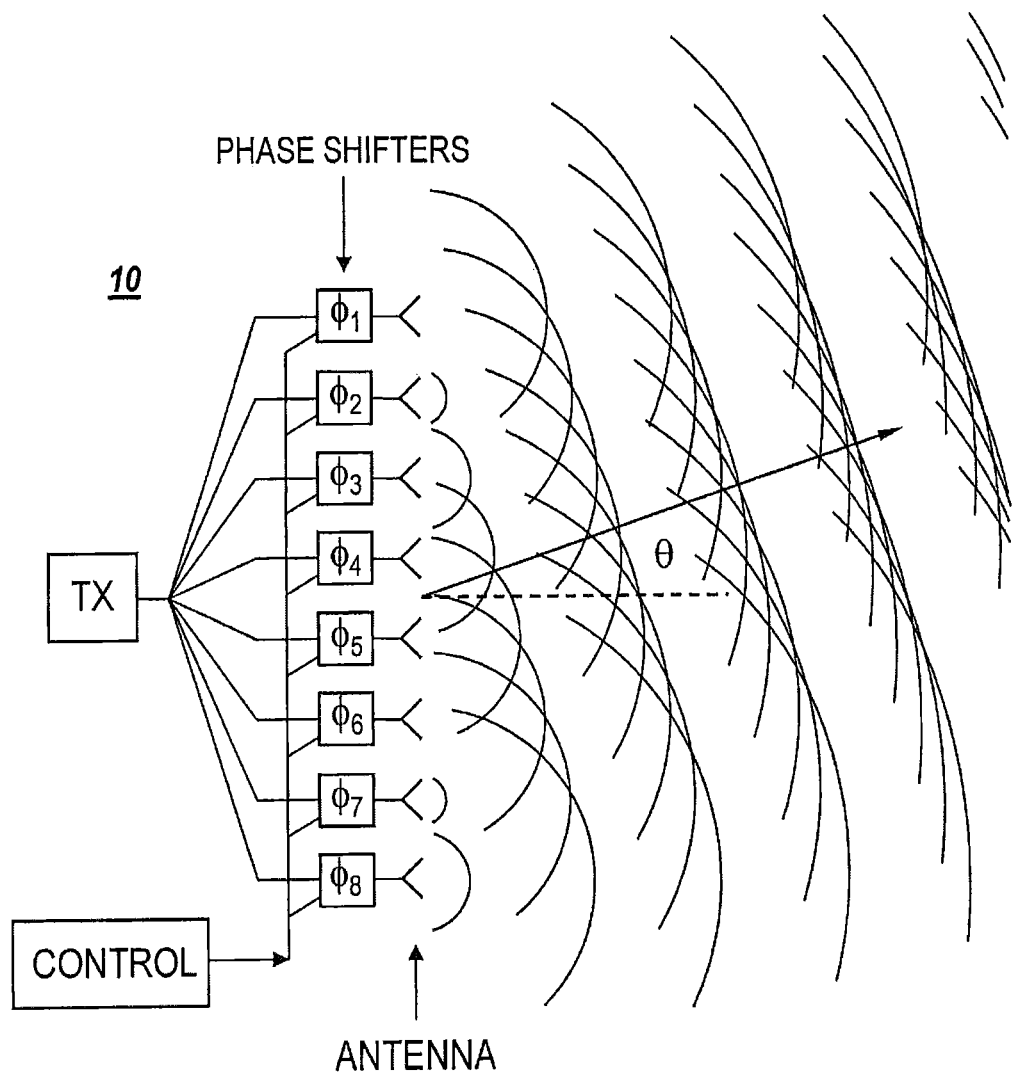
FIG. 1A is a block diagram of a phased array antenna according to the prior art.
Figure 1B:
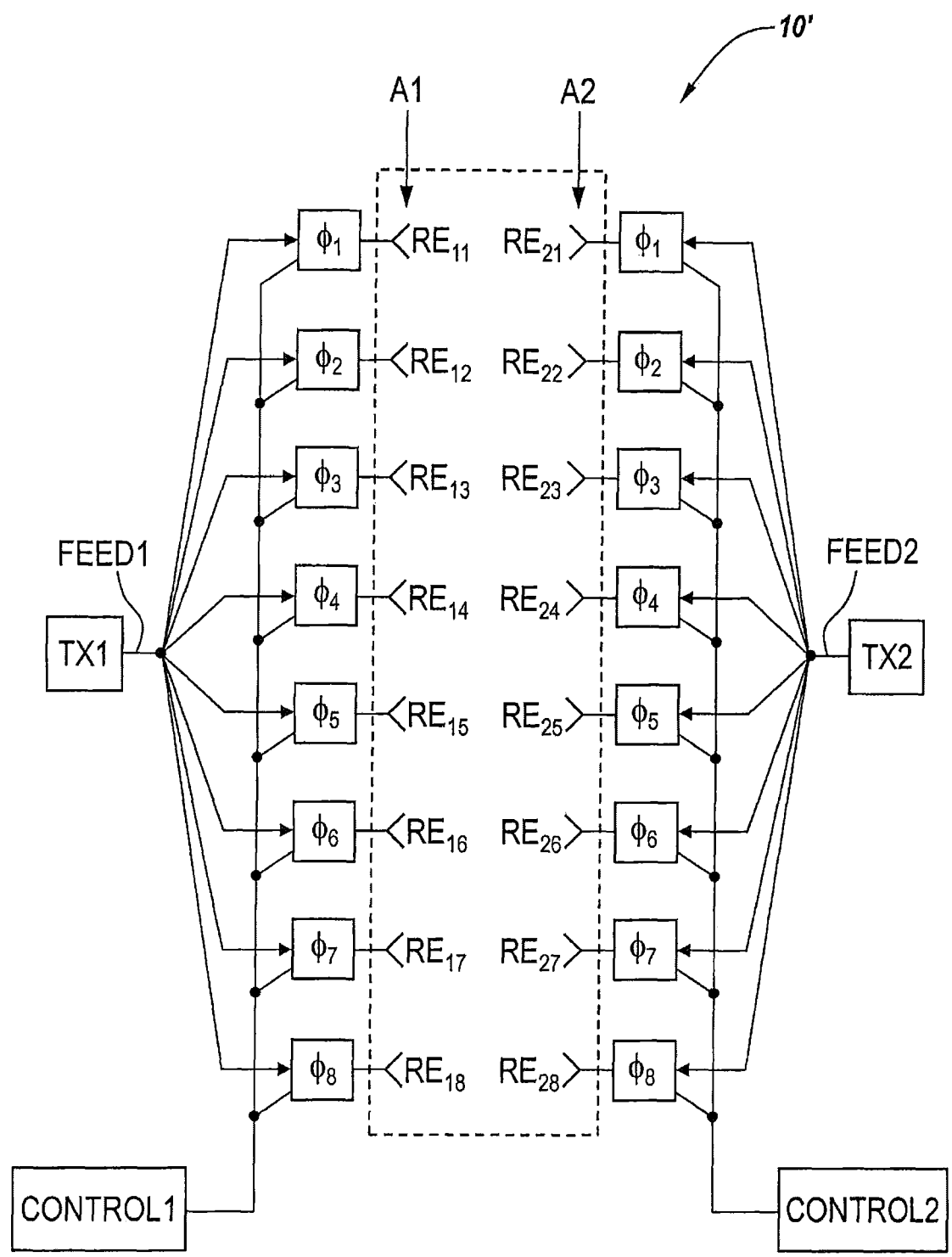
FIG. 1B is a block diagram of a base station antenna (BSA) according to the prior art.
Figure 1C:
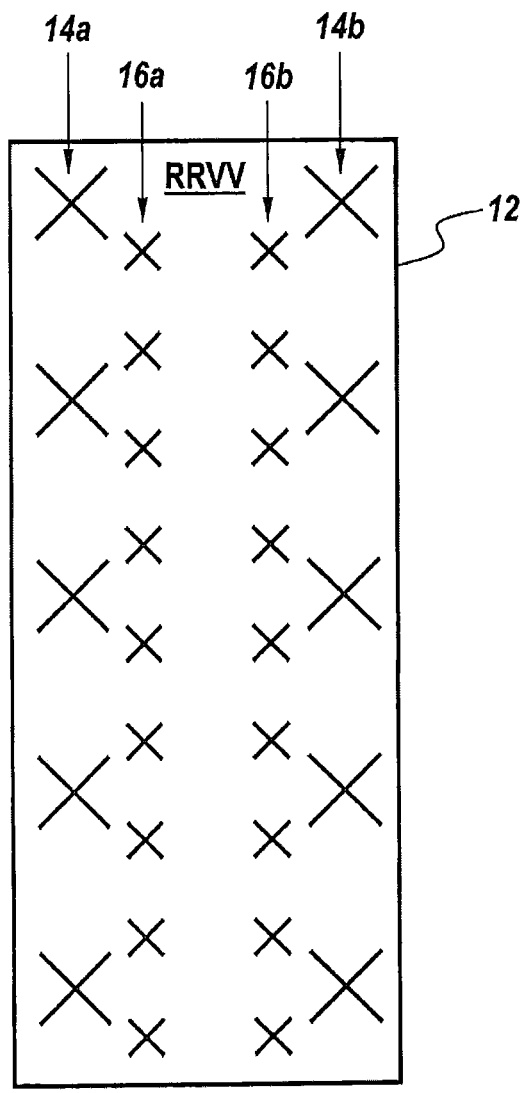
FIG. 1C is a plan layout view of an RRVV base station antenna, which shows the arrangement of two linear arrays of low-band radiating elements (X) and two linear arrays of high-band radiating elements (x), according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
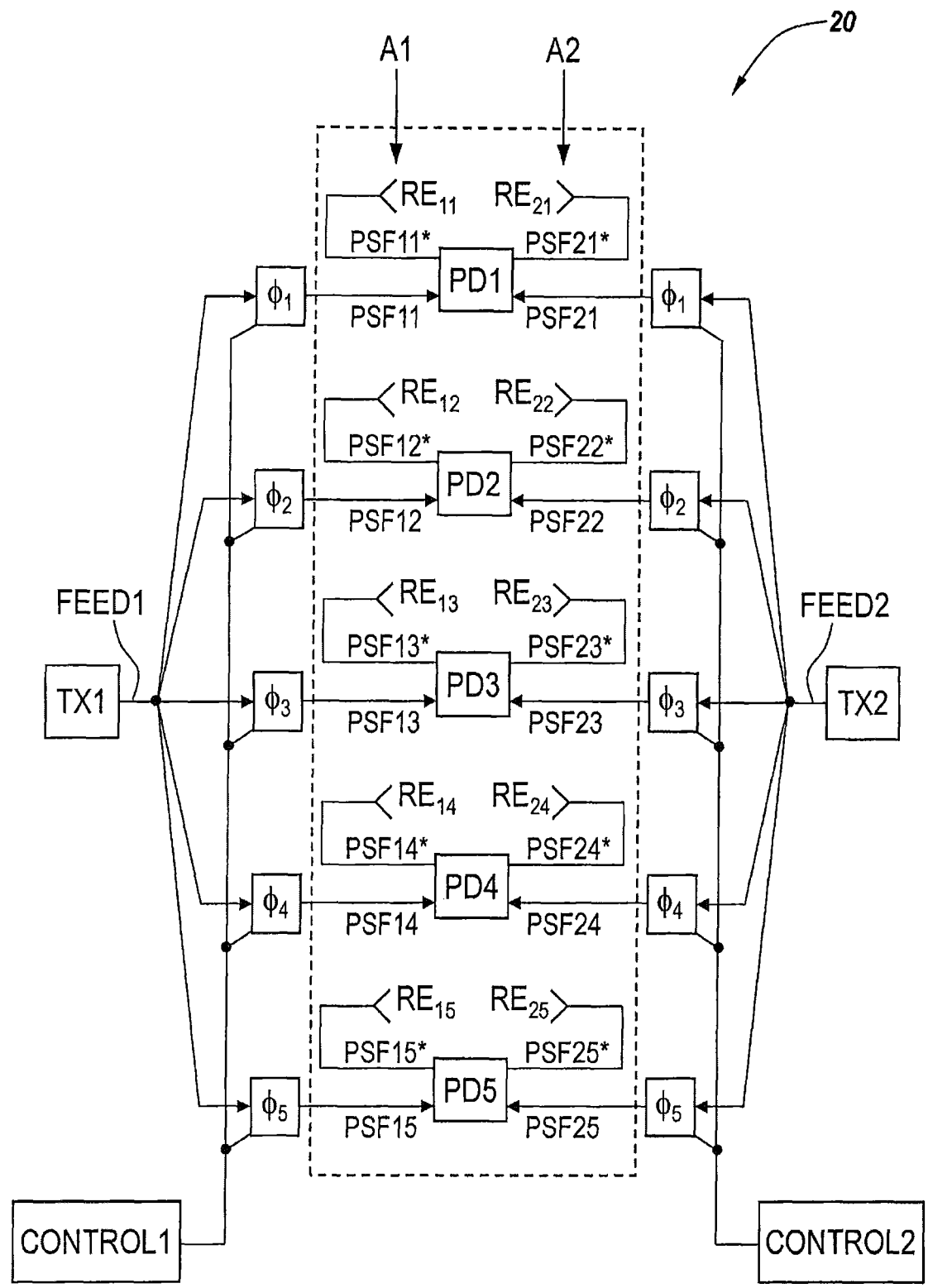
FIG. 2 is a block diagram of a base station antenna (BSA) having a plurality of HPBW-enhancing power divider circuits therein, according to an embodiment of the present invention.

Referring now to FIG. 2, a base station antenna (BSA) 20 according to an embodiment of the invention is illustrated as including two linear arrays (i.e., columns) of five (5) radiating elements ($RE_{11}$-$RE_{15}$, $RE_{21}$-$RE_{25}$) per array, which define left and right low-band antennas (A1, A2). As shown, each left and right pair of radiating elements (($RE_{11}$-$RE_{21}$), ($RE_{12}$-$RE_{22}$), . . . , ($RE_{15}$-$RE_{25}$)) is responsive to a corresponding pair of modified phase-shift feed signals ((PSF11, PSF21*), (PSF12, PSF22*), . . . , (PSF15, PSF25*)), which are generated by corresponding power divider circuits (PDn=PD1, PD2, . . . , or PD5). Each of the power divider circuits PDn is responsive to a pair of phase shift feed (PSF) signals generated by corresponding left-side phase shifters ($\phi_1$-$\phi_5$) and right-side phase shifters ($\phi_1$-$\phi_5$). The left-side phase shifters ($\phi_1$-$\phi_5$) are collectively responsive to a first RF feed signal (FEED1) generated by a first transmitter TX1 and phase controls signals generated by a first controller (CONTROL1). The right phase shifters ($\phi_1$-$\phi_5$) are collectively responsive to a second RF feed signal (FEED1) generated by a second transmitter TX2 and phase control signals generated by a second controller (CONTROL2).

The left and right low-band antennas A1 and A2 may or may not transmit in the same frequency band. For example, in some cases, the two antennas A1 and A2 may be operated to support multi-input-multi-output ("MIMO") transmissions where the same signal is transmitted through multiple linear arrays of radiating elements after being "pre-distorted" (based on known characteristics of a specified channel) so that the multiple transmitted signals (in the same frequency band) constructively combine at a receiver location. This "MIMO" technique can be very effective in reducing the effects of fading, signal reflections and the like.

In other cases, the two antennas A1 and A2 may point in different directions to provide independent antenna beams in the same or different frequency bands. Thus, one low band antenna (e.g., A1) may transmit in a first frequency band (e.g., the 700 MHz band) and the other low band antenna (A2) may transmit in a different frequency band (e.g., the 800 MHz band), which means the transmitted signals from A1 and A2 will not overlap in frequency.

As will be understood by those skilled in the art, the left side (and right side) phase shifters ($\phi_1$-$\phi_5$) may operate within a larger phase shifter circuit that typically performs multiple functions. First, this phase shifter circuit may perform a 1×5 power split so that a corresponding RF feed signal (e.g., FEED1, FEED2) can be sub-divided into five lower power feed signals that are directly fed to corresponding power divider circuits PDn. Second, the phase shifter circuit may generate a phase taper across the individual feed signals (e.g., −2°, −1°, 0°, +1°, +2° phase variations), thereby yielding the lower power feed signals as phase-shifted feed signals (PSF). Advantageously, this phase taper, which can create a desired electronic "downtilt" on the elevation pattern of the resulting antenna beam, can be remotely controlled and adjusted.

Moreover, as highlighted below with respect to cross-coupled power divider circuit 30e of FIG. 3E, according to some alternative embodiments of the invention, a single power divider circuit may be placed between each feed signal transmitter (TX1, TX2) and corresponding phase shifter ($\phi_1$-$\phi_5$) to thereby yield improvements in half power beam widths (HPBW). Nonetheless, when the two antennas A1 and A2 are operated to support multi-input-multi-output ("MIMO") transmissions, the same downtilt will be applied to both antennas. In addition, when one antenna covers one frequency band (e.g., 700 MHz band) and the other antenna covers another frequency band (e.g., 800 MHz band), the downtilt will be different on the two bands. In both of these applications, the embodiment of FIG. 3E may be less preferred relative to the embodiment of FIG. 2 and the embodiments of FIGS. 4B-4C, described hereinbelow. Moreover, the embodiment of FIG. 3E may result in relatively higher signal losses by virtue of the fact that higher amounts of signal energy may be lost to ground (GND) within the power divider circuit 30e. Nonetheless, as shown by FIG. 5, which is a graph comparing a −180° to +180° beam width profile of an RRVV antenna (with one column activated) versus a beam width profile of a corresponding RRVV antenna that utilizes the power divider circuit of FIG. 3E, HPBW improvements can be achieved with a single power divider circuit 30e for the RR arrays of an RRVV antenna.

Figure 3A:
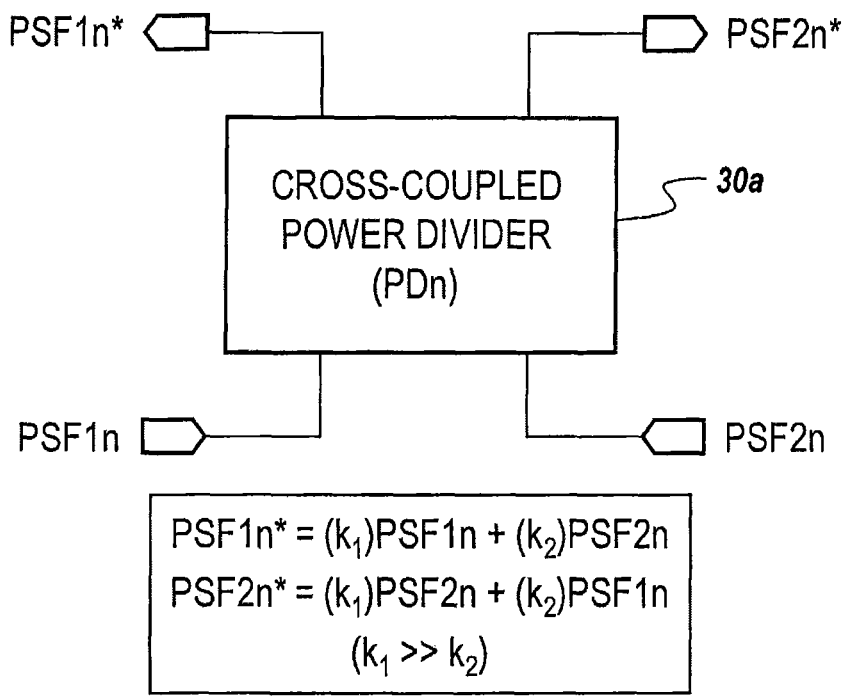
FIG. 3A is a block diagram of an HPBW-enhancing power divider circuit, according to an embodiment of the present invention.

Referring now to FIG. 3A, a power divider circuit 30a, which may be utilized to perform the operations of the power divider circuits PD1-PD5 of FIG. 2, is illustrated as generating a pair of modified phase-shifted feed signals PSF1n* and PSF2n* by intentionally cross-coupling a pair of phase-shifted input feed signals PSF1n and PSF2n, which can be generated by respective phase-shifters ($\phi_n$) associated with the spaced-apart antennas A1 and A1 in the BSA 20, as shown by FIG. 2. In particular, the modified phase-shifted feed signal PSF1n* is generated as a first combination of a first phase-shifted input feed signal PSF1n and a second phase-shifted input feed signal PSF2n. According to some embodiments of the invention, the modified phase-shifted feed signal PSF1n* is generated according to the following relationship: PSF1n*=($k_1$)PSF1n+($k_2$)PSF2n, where PSF1n denotes a first RF feed signal, PSF2n denotes a second RF feed signal, $k_1$ is a first power conversion coefficient and $k_2$ is a second power conversion coefficient, and where: $0.7 \leq k_1 \leq 0.9$ and $0.0026 \leq k_2 \leq 0.027$. Similarly, the modified phase-shifted input feed signal PSF2n* is generated as: PSF2n*=($k_1$*)PSF2n+($k_2$*)PSF1n, where $k_1$* is a third power conversion coefficient and $k_2$* is a fourth power conversion coefficient, and where: $0.7 \leq k_1^* \leq 0.9$ and $0.0026 \leq k_2^* \leq 0.027$. Finally, whereas the cross-coupling operations illustrated by FIG. 3A are performed on already phase-shifted feed signals (PSFs), these operations may be performed "globally" on each of the transmitter-generated feed signals FEED1, FEED2, as shown by FIG. 3E.

Figure 3B:
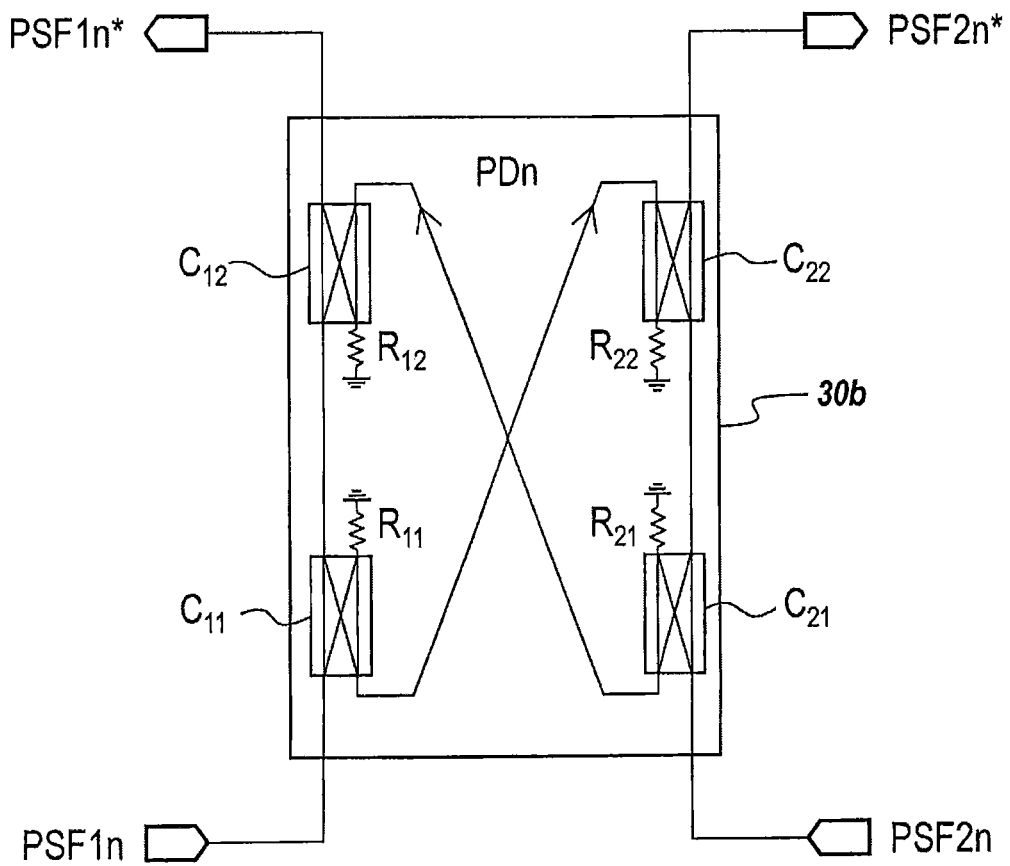
FIG. 3B is an electrical schematic of an HPBW-enhancing power divider circuit, according to an embodiment of the present invention.
Figure 3C:
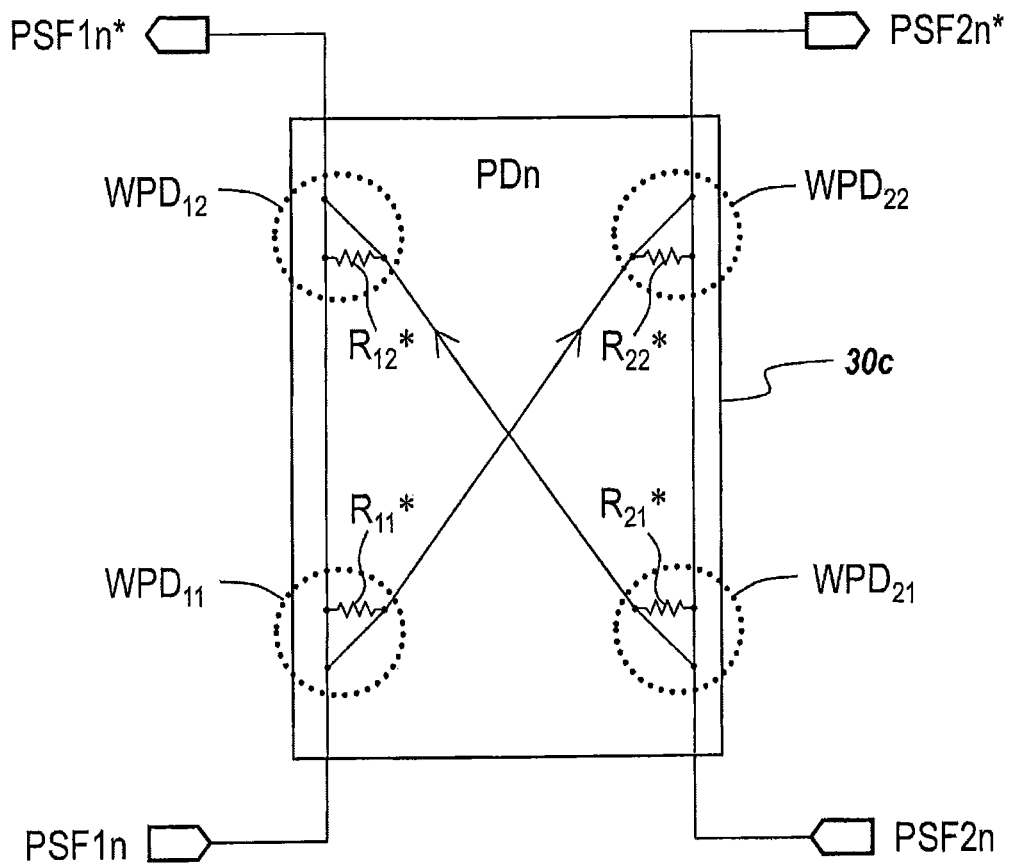
FIG. 3C is an electrical schematic of an HPBW-enhancing power divider circuit, according to an embodiment of the present invention.
Figure 3D:
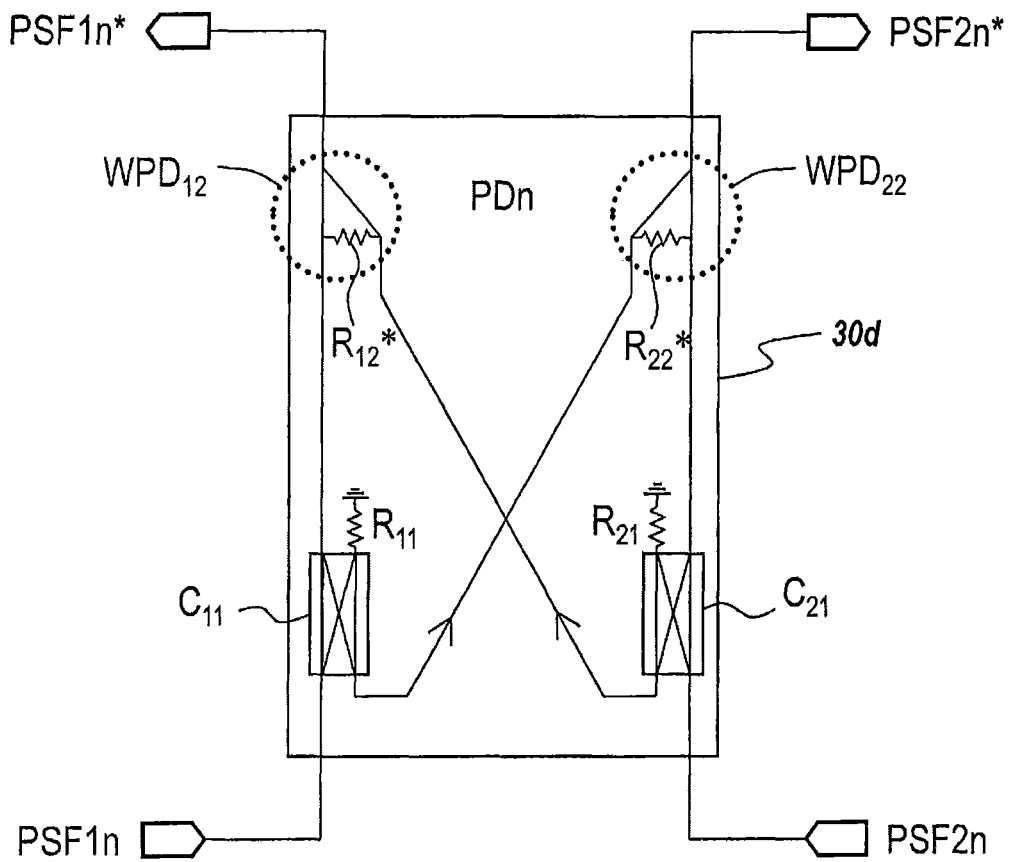
FIG. 3D is an electrical schematic of an HPBW-enhancing power divider circuit, according to an embodiment of the present invention.
Figure 3E:
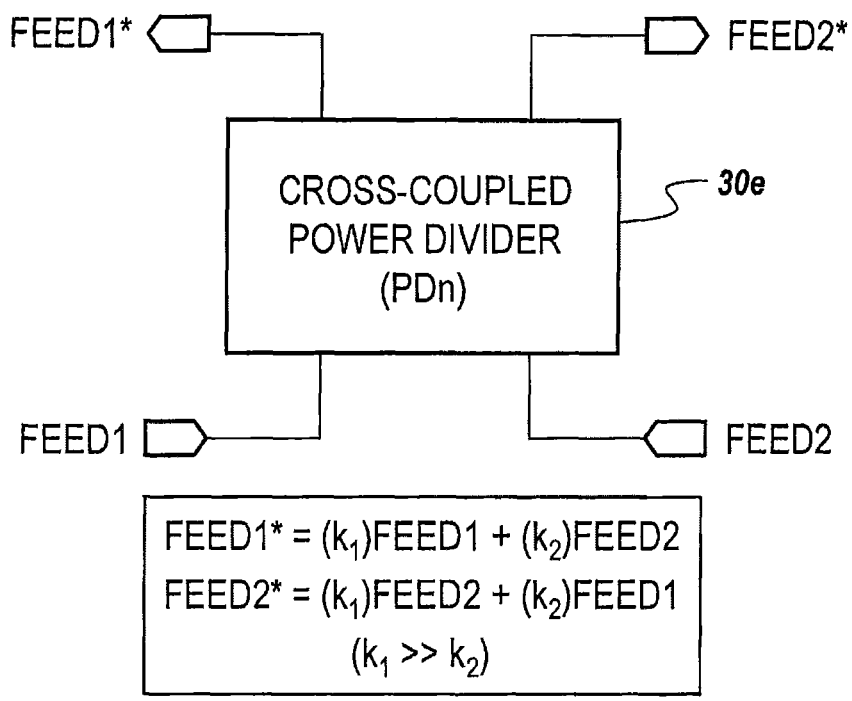
FIG. 3E is an electrical schematic of an HPBW-enhancing power divider circuit, according to an embodiment of the present invention.

As illustrated by the embodiments of FIGS. 3B-3D, multiple alternative circuit designs may be utilized to perform the operations illustrated by the power divider circuit 30a of FIG. 3A. For example, as shown by the power divider circuit 30b of FIG. 3B, two pairs of 4-port cascaded directional couplers (($C_{11}$-$C_{12}$), ($C_{21}$-$C_{22}$)) may be cross-coupled, with single-port resistor termination via $R_{11}$, $R_{12}$, $R_{21}$, $R_{22}$, to thereby convert phase-shifted input feed signals PSF1n, PSF2n to modified phase-shifted input feed signals PSF1n*, PSF2n*.

Figure 3F:
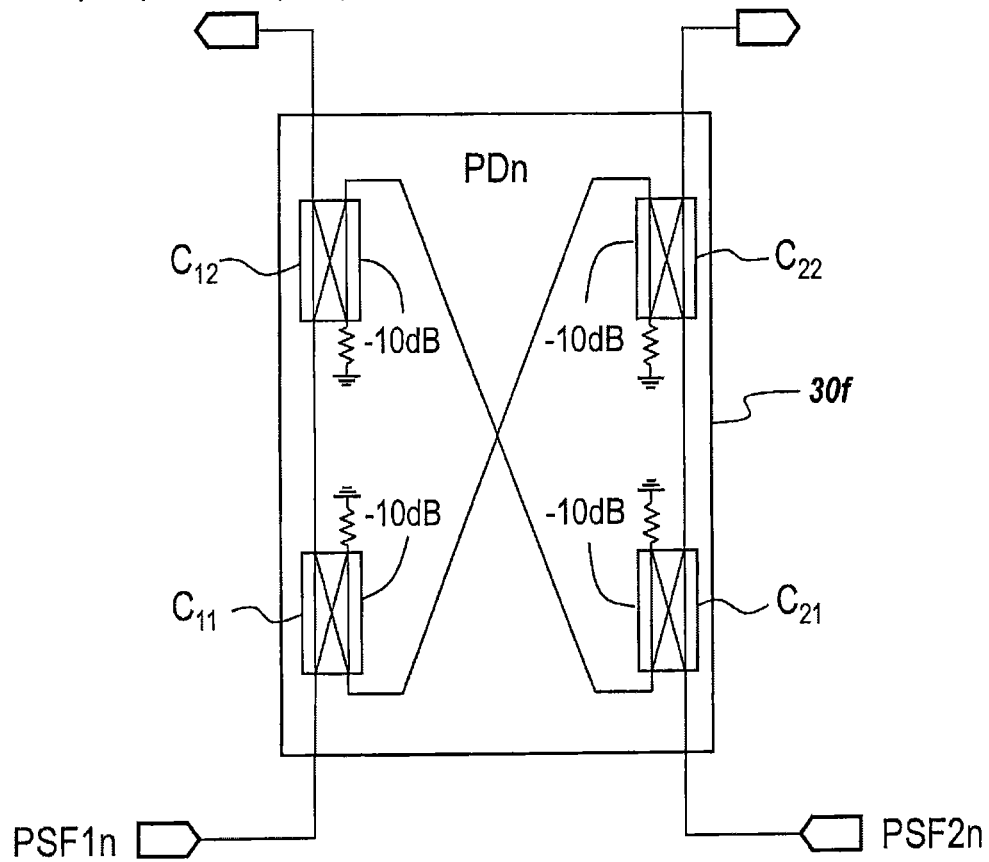
FIG. 3F is an electrical schematic of an HPBW-enhancing power divider circuit containing four −10 dB four-port directional couplers, according to an embodiment of the present invention.

According to some embodiments of the invention, the directional couplers $C_{11}$, $C_{12}$, $C_{21}$ and $C_{22}$ of FIG. 3B may be configured as four-port directional couplers (e.g., −10 dB coupler) having equivalent characteristics, where $R_{11}$, $R_{12}$, $R_{21}$, $R_{22}$ can be 50 ohms. If, as illustrated by FIG. 3B and the power divider circuit 30f of FIG. 3F, the directional couplers $C_{11}$, $C_{12}$, $C_{21}$ and $C_{22}$ are equivalent −10 dB couplers, then coupler $C_{11}$ will pass 90% of the energy associated with the first phase-shifted input feed signal PSFn1 to an input of coupler $C_{12}$ and couple 10% of the energy associated with the first phase-shifted input feed signal PSFn1 to coupler $C_{22}$, where 90% of the coupled 10% signal will pass through termination resistor $R_{22}$ to ground (and lost) and 10% of the coupled 10% signal (i.e., 1%=0.01, or −20 dB) will be provided to the output of $C_{22}$ (as a signal component of PSF2n*). Likewise, coupler $C_{21}$ will pass 90% of the energy associated with the second phase-shifted input feed signal PSFn2 to an input of coupler $C_{22}$ and couple 10% of the energy associated with the second phase-shifted input feed signal PSFn2 to coupler $C_{12}$, where 90% of the coupled 10% signal will pass through termination resistor $R_{12}$ to ground (and lost) and 10% of the coupled 10% signal (i.e., 1%) will be provided to the output of $C_{12}$ (as a component of PSF1n*). In a similar manner, 90% of the 90% PSF1n signal received at an input of coupler $C_{12}$ will be passed as "(0.81)PSF1n", the primary energy component of PSF1n*, and 90% of the 90% PSF2n signal received at an input of coupler $C_{22}$ will be passed as "(0.81)PSF2n", the primary energy component of PSF2n*.

FIG. 3C illustrates an alternative power divider circuit 30c, which substitutes four Wilkinson power dividers $WPD_{11}$, $WPD_{12}$, $WPD_{21}$ and $WPF_{22}$, containing resistors $R^*_{11}$, $R^*_{12}$, $R^*_{21}$ and $R^*_{22}$ for the directional couplers $C_{11}$, $C_{12}$, $C_{21}$ and $C_{22}$ illustrated in FIG. 3B. The values of these resistors $R^*_{11}$, $R^*_{12}$, $R^*_{21}$ and $R^*_{22}$ may be unequal in some embodiments of the invention in order to achieve asymmetric coupling where $k_1$ and $k_1$* are unequal, and $k_2$ and $k_2$* are unequal. And, in the embodiment of FIG. 3D, a power divider circuit 30d is illustrated as including a pair of directional couplers $C_{11}$, $C_{21}$ (of FIG. 3B) in combination with a pair of Wilkinson power dividers $WPD_{12}$ and $WPF_{22}$ (of FIG. 3C). Each of these embodiments advantageously supports the cross-coupling of feed signal energy highlighted above with respect to FIG. 3A.

Figure 4A:
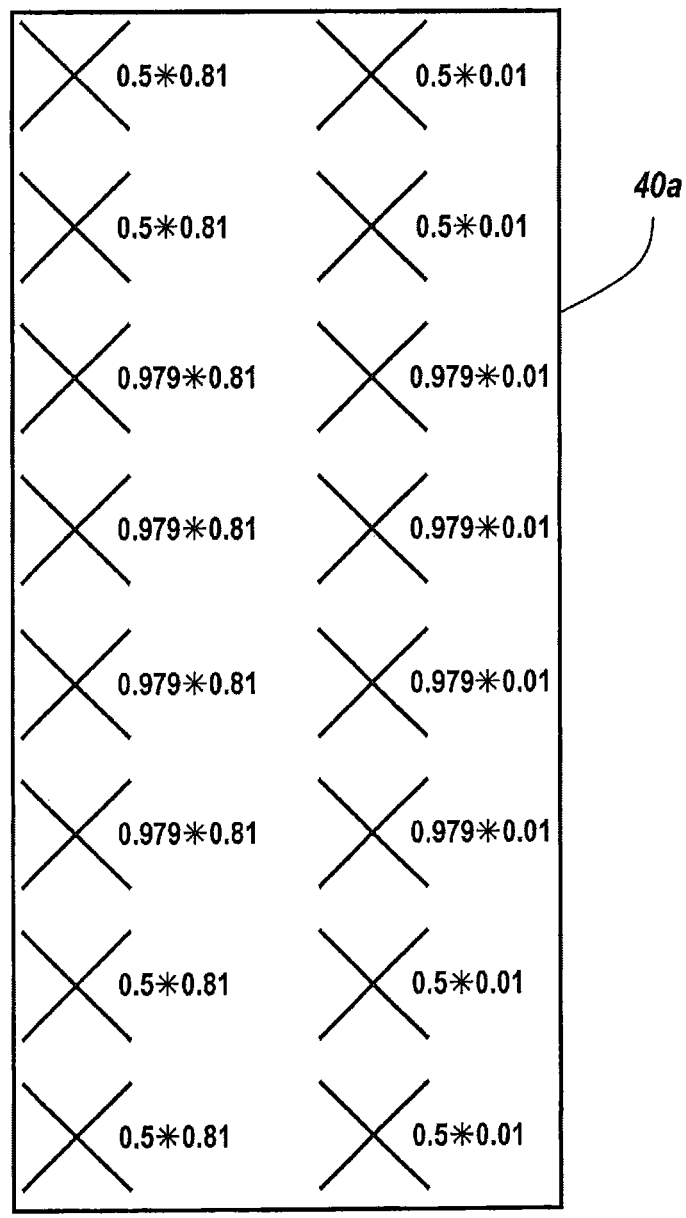
FIG. 4A is a plan view of left and right columns of low-band radiating elements within a base station antenna, which illustrates how phase-shifted feed (PSF) signals associated with the left column of low-band radiating elements are provided, at reduced power levels, to the left and right columns of low-band radiating elements, according to embodiments of the present invention.
Figure 4B:
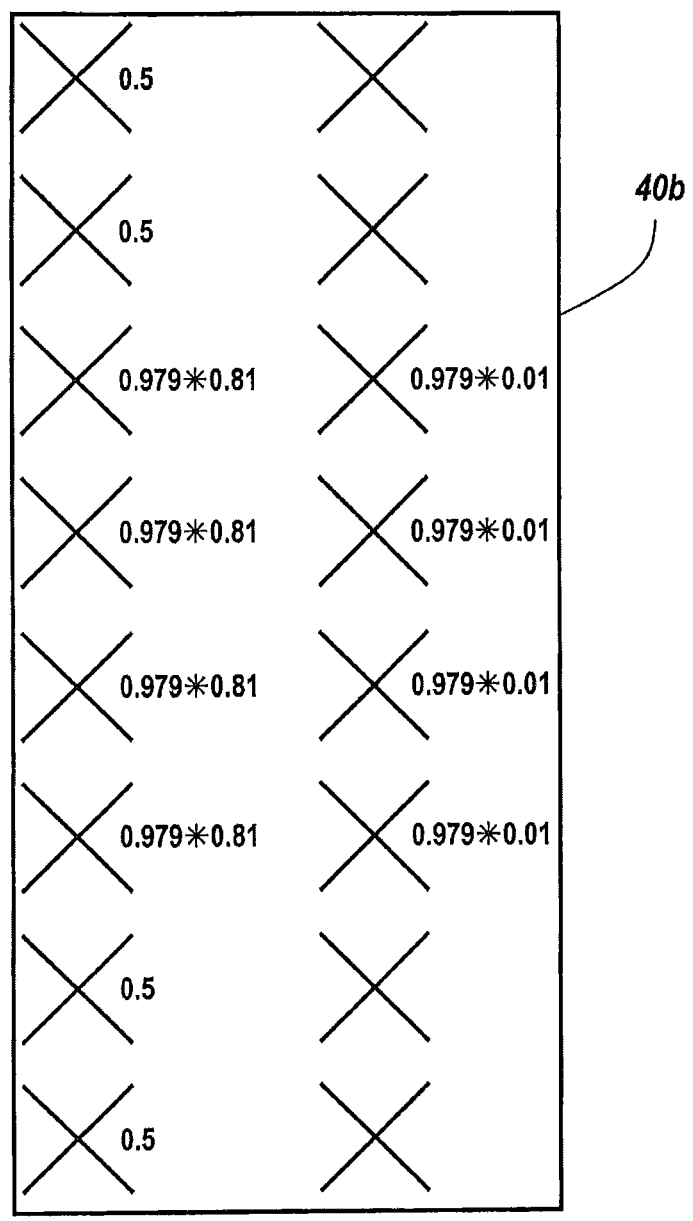
FIG. 4B is a plan view of left and right columns of low-band radiating elements within a base station antenna, which illustrates how phase-shifted feed (PSF) signals associated with the left column of low-band radiating elements are provided, at reduced power levels, to half of the radiating elements in the left and right columns of low-band radiating elements, according to embodiments of the present invention.
Figure 4C:
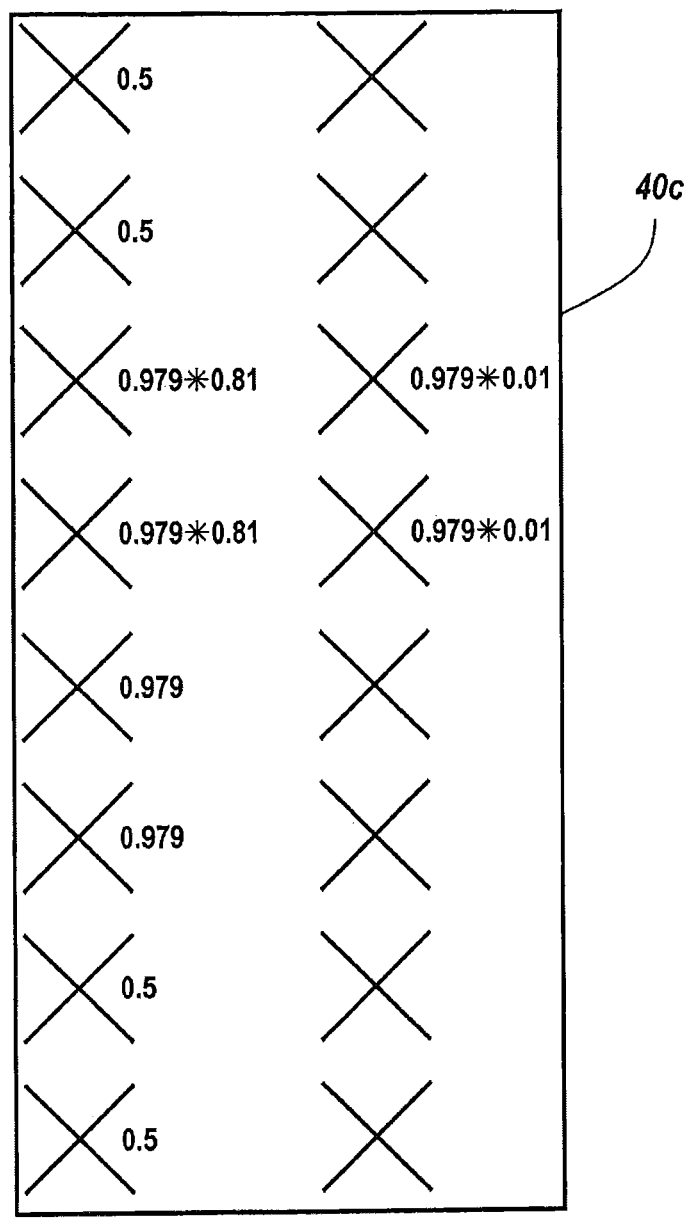
FIG. 4C is a plan view of two columns of low-band radiating elements within a base station antenna, which illustrates how phase-shifted feed (PSF) signals associated with the left column of low-band radiating elements are provided, at reduced power levels, to one quarter of the radiating elements in the left and right columns of low-band radiating elements, according to embodiments of the present invention.
Figure 5:
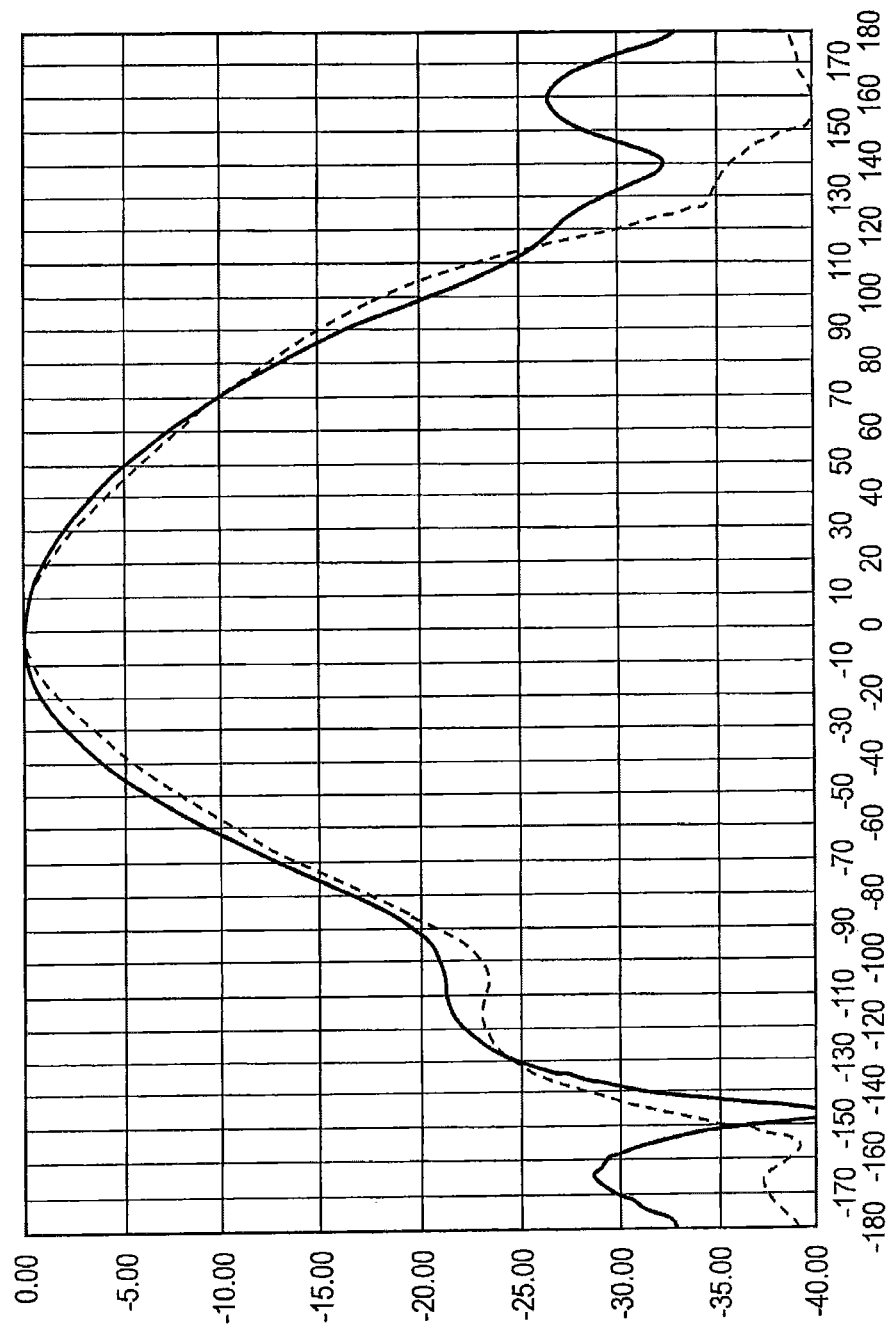
FIG. 5 is a graph comparing an azimuth beam width profile of an RRVV antenna (with one column activated), as shown by a solid line, versus an azimuth beam width profile of a corresponding RRVV antenna that utilizes the power divider circuit of FIG. 3E, where $k_1=0.81$ and $k_2=0.01$.

As shown by FIGS. 3F and 4A-4C, left and right columns of low-band radiating elements may utilize varying numbers of cross-coupled power divider circuits 30f within base station antennas 40a, 40b and 40c, to achieve varying levels of half-power beam width HPBW reduction. In FIG. 4A, all eight phase-shifted feed signals PSF1n associated with a left-side array of radiating elements may be generated at 0.979 or 0.5 power levels before undergoing cross-coupling to further reduced power levels of 0.979(0.81) and 0.5(0.81) for the left-side array and 0.979(0.01) and 0.5(0.01), at 1% coupling, for all radiating elements in the right-side array. This 1% coupling is a form of "intentional" signal interference to achieve appreciable HPBW reduction with minimal adverse consequences to the integrity of the primary feed signal(s) associated with the right-side array of radiating elements. In contrast, in FIG. 4B, only the center four radiating elements in the left-side and right-side arrays receive coupled signals, whereas in FIG. 4C, only a single pair of radiating elements receive coupled signals. Nonetheless, each of these "intentional" cross-coupling embodiments can be utilized advantageously to improve HPBW to varying degrees at varying levels of power efficiency.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An antenna array, comprising:
   first and second radiating elements responsive to first and second hybrid radio frequency (RF) signals, respectively; and
   a power divider circuit comprising a first cascaded pair of power dividers cross-coupled with a second cascaded pair of power dividers, said power divider circuit configured to generate the first and second hybrid RF signals as power-reduced combinations of first and second RF input signals received at input terminals thereof.

2. The antenna array of claim 1, wherein the first cascaded pair of power dividers is responsive to the first RF input signal and a power-reduced version of the second RF input signal; and wherein the second cascaded pair of power dividers is responsive to the second RF input signal and a power-reduced version of the first RF input signal.

3. The antenna array of claim 2, wherein the first cascaded pair of power dividers is configured to generate the first hybrid RF signal as a combination of a 70-90 percent energy contribution of the first RF input signal with a 0.26-2.7 percent energy contribution of the second RF input signal; and wherein the second cascaded pair of power dividers is configured to generate the second hybrid RF signal as a 70-90 percent energy contribution of the second RF input signal with a 0.26-2.7 percent energy contribution of the first RF input signal.

4. The antenna array of claim 2, wherein the first cascaded pair of power dividers is configured to pass a portion of the second RF input signal through a first resistor to ground; and wherein the second cascaded pair of power dividers is configured to pass a portion of the first RF input signal through a second resistor to ground.

5. The antenna array of claim 2, wherein the first cascaded pair of power dividers is configured as a net lossy circuit with respect to any portion of the second RF input signal that is coupled thereto; and wherein the second cascaded pair of power dividers is configured as a net lossy circuit with respect to any portion of the first RF input signal that is coupled thereto.

6. The antenna array of claim 2, wherein each of the first cascaded pair of power dividers is selected from a group consisting of directional couplers and Wilkinson power dividers.

7. The antenna array of claim 2, wherein each of the first cascaded pair of power dividers and second cascaded pair of power dividers is selected from a group consisting of directional couplers, branch line couplers, Wilkinson power dividers and reactive T-splitters, and combinations thereof.

8. An antenna array, comprising:
   first and second arrays of radiating elements;
   a first phase shifter configured to generate a first plurality of RF feed signals that are phase-shifted relative to each other, in response to a first RF input feed signal;
   a second phase shifter configured to generate a second plurality of RF feed signals that are phase-shifted relative to each other, in response to a second RF input feed signal; and
   a power divider circuit configured to drive a first one of said first array of radiating elements with a first power-reduced combination of a first one of the first plurality of RF feed signals and a first one of the second plurality of RF feed signals.

9. The antenna array of claim 8, wherein said power divider circuit is further configured to drive a first one of said second array of radiating elements with a second power-reduced combination of the first one of the first plurality of RF feed signals and the first one of the second plurality of RF feed signals.

10. The antenna array of claim 9, wherein the first power-reduced combination of the first one of the first plurality of RF feed signals and the first one of the second plurality of RF feed signals is defined as PSF1$n$*, where:

$$\text{PSF1}n^* = (k_1)\text{PSF1}n + (k_2)\text{PSF2}n,$$

PSF1$n$ denotes the first one of the first plurality of RF feed signals, PSF2$n$ denotes the first one of the second plurality of RF feed signals, $k_1$ is a first power conversion coefficient and $k_2$ is a second power conversion coefficient, and where: $0.7 \leq k_1 \leq 0.90$ and $0.0026 \leq k_2 \leq 0.027$.

11. The antenna array of claim 10, wherein the second power-reduced combination of the first one of the first plurality of RF feed signals and the first one of the second plurality of RF feed signals is defined as PSF2$n$*, where PSF2$n^* = (k_1^*)\text{PSF2}n + (k_2^*)\text{PSF1}n$, $k_1^*$ is a third power conversion coefficient and $k_2^*$ is a fourth power conversion coefficient, and where: $0.7 \leq k_1^* \leq 0.90$ and $0.0026 \leq k_2^* \leq 0.027$.

12. The antenna array of claim 8, wherein the first power-reduced combination of the first one of the first plurality of RF feed signals and the first one of the second plurality of RF feed signals is defined as PSF1$n$*, where:

$$\text{PSF1}n^* = (k_1)\text{PSF1}n + (k_2)\text{PSF2}n,$$

PSF1$n$ denotes the first one of the first plurality of RF feed signals, PSF2$n$ denotes the first one of the second plurality of RF feed signals, $k_1$ is a first power conversion coefficient and $k_2$ is a second power conversion coefficient, and where: $0.7 \leq k_1 \leq 0.90$ and $0.0026 \leq k_2 \leq 0.027$.

13. The antenna array of claim 8, wherein said power divider circuit comprises a first cascaded pair of power dividers cross-coupled with a second cascaded pair of power dividers.

14. The antenna array of claim 13, wherein the first cascaded pair of power dividers is responsive to the first one of the first plurality of RF feed signals and a power-reduced version of the first one of the second plurality of RF feed signals; and wherein the second cascaded pair of power dividers is responsive to the first one of the second plurality of RF feed signals and a power-reduced version of the first one of the first plurality of RF feed signals.

15. The antenna array of claim 8, wherein a second one of said first array of radiating elements is directly responsive to a second one of the first plurality of RF feed signals; and wherein a second one of said second array of radiating elements is directly responsive to a second one of the second plurality of RF feed signals.

16. A base station antenna, comprising:

first and second arrays of low-band radiating elements extending adjacent first and second arrays of high-band radiating elements; and a power divider circuit responsive to a first feed signal having a first frequency associated with said first array of low-band radiating elements and a second feed signal having a second frequency associated with said second array of low-band radiating elements, said power divider circuit configured to drive a first low-band radiating element in said first array of low-band radiating elements with a first hybrid feed signal comprising a power-reduced version of the first feed signal and a power-reduced version of the second feed signal.

17. The base station antenna of claim 16, wherein the first hybrid feed signal is a 10%-30% power-reduced version of the first feed signal and a 97.3%-99.74% power-reduced version of the second feed signal.

18. The base station antenna of claim 16, wherein said power divider circuit is further configured to drive a first low-band radiating element in said second array of low-band radiating elements with a second hybrid feed signal comprising a power-reduced version of the second feed signal and a power-reduced version of the first feed signal.

19. The base station antenna of claim 18, wherein the first hybrid feed signal is a 10%-30% power-reduced version of the first feed signal and a 97.3%-99.74% power-reduced version of the second feed signal; and wherein the second hybrid feed signal is a 10%-30% power-reduced version of the second feed signal and a 97.3%-99.74% power-reduced version of the first feed signal.

20. The bases station antenna of claim 16, wherein said power divider circuit comprises a plurality of power dividers selected from a group consisting of directional couplers, branch line couplers, Wilkinson power dividers and reactive T-splitters.

* * * * *